United States Patent
Kiuchi et al.

(10) Patent No.: US 10,804,131 B2
(45) Date of Patent: Oct. 13, 2020

(54) CARRIER PLATE REMOVING METHOD (71) Applicant: DISCO CORPORATION, Tokyo (JP)

(72) Inventors: Hayato Kiuchi, Tokyo (JP); Katsuhiko Suzuki, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/535,413

(22) Filed: Aug. 8, 2019

(65) Prior Publication Data

US 2020/0051847 A1 Feb. 13, 2020

(30) Foreign Application Priority Data

Aug. 13, 2018 (JP) .................................. 2018-152308

(51) Int. Cl.
- *H01L 21/00* (2006.01)
- *H01L 21/683* (2006.01)
- *B23K 26/38* (2014.01)
- *C23C 16/458* (2006.01)
- *H01L 21/687* (2006.01)
- *H01L 21/304* (2006.01)

(52) U.S. Cl.
CPC .......... *H01L 21/6835* (2013.01); *B23K 26/38* (2013.01); *C23C 16/4581* (2013.01); *C23C 16/4584* (2013.01); *H01L 21/3043* (2013.01); *H01L 21/68764* (2013.01)

(58) Field of Classification Search
None
See application file for complete search history.

(56) References Cited

U.S. PATENT DOCUMENTS

| 9,595,463 | B2* | 3/2017 | Priewasser | .......... H01L 21/6836 |
| 9,633,887 | B2* | 4/2017 | Fukazawa | ......... H01L 21/67132 |
| 2013/0300045 | A1* | 11/2013 | Komatsu | ................ B23Q 3/088 |
| | | | | 269/21 |
| 2014/0084423 | A1* | 3/2014 | Priewasser | .............. H01L 21/78 |
| | | | | 257/619 |
| 2014/0305916 | A1* | 10/2014 | Wei | ..................... H01L 21/6835 |
| | | | | 219/121.64 |

FOREIGN PATENT DOCUMENTS

JP 2016201519 A 12/2016

* cited by examiner

*Primary Examiner* — Ali Naraghi
(74) *Attorney, Agent, or Firm* — Greer Burns & Crain Ltd.

(57) ABSTRACT

There is provided a carrier plate removing method of removing a carrier plate from a workpiece disposed on a front surface of the carrier plate with a provisional bond layer interposed between the carrier plate and the workpiece. The carrier plate removing method includes a first holding step of holding the carrier plate and exposing the workpiece, a stepped portion forming step of forming a stepped portion in which an back surface side projects outward of a front surface side at an outer peripheral edge of the carrier plate, a second holding step of holding the workpiece and exposing the carrier plate, and a carrier plate removing step of removing the carrier plate from the workpiece by applying a force to the stepped portion and moving the carrier plate in a direction of being separated from the workpiece by a removing unit.

2 Claims, 5 Drawing Sheets

CARRIER PLATE REMOVING METHOD

BACKGROUND OF THE INVENTION

Field of the Invention

The present invention relates to a carrier plate removing method of removing a carrier plate from a workpiece superposed on the carrier plate with a provisional bond layer interposed therebetween.

Description of the Related Art

A device chip including a device such as an electronic circuit or the like is an essential constituent element in an electronic apparatus typified by a mobile phone or a personal computer. Device chips are obtained by, for example, demarcating the front surface of a wafer formed of a semiconductor material such as silicon or the like into a plurality of regions by planned dividing lines (streets), forming devices in the respective regions, and thereafter dividing the wafer along the planned dividing lines.

A device chip obtained by the method as described above is, for example, fixed to a mother substrate for a chip size package (CSP), electrically connected by a method such as wire bonding or the like, and thereafter sealed by a mold resin. Thus, forming a packaged device by sealing the device chip by the mold resin can protect the device chip from external factors such as a shock, light, heat, water, or the like.

A packaging technology referred to as fan-out wafer level packaging (FOWLP) has recently started to be adopted which forms package terminals outside the region of a device chip by using a wafer-level rewiring technology (see Japanese Patent Laid-Open No. 2016-201519, for example). In addition, a packaging technology referred to as fan-out panel level packaging (FOPLP) has also been proposed which manufactures packaged devices en bloc on the level of a panel (typically a glass substrate used for manufacturing a liquid crystal panel) having a larger size than a wafer.

In FOPLP, for example, a wiring layer (redistribution layer (RDL)) is formed on the front surface of a carrier plate as a provisional substrate with a provisional bond layer interposed therebetween, and device chips are bonded to the wiring layer. Next, the device chips are sealed by a mold resin, and thereby a package panel is obtained. Thereafter, packaged devices are completed by thinning the package panel by a method such as grinding or the like, and thereafter dividing the package panel.

SUMMARY OF THE INVENTION

In FOPLP described above, for example, the package panel is divided into the packaged devices, and thereafter the carrier plate is removed from the packaged device. Specifically, each of the packaged devices is picked up from the carrier plate. However, when the packaged devices have a small size, it is difficult to pick up the packaged devices from the carrier plate.

On the other hand, it is conceivable that the carrier plate may be peeled off and removed from the package panel before the package panel is divided into the packaged devices. However, the provisional bond layer has a certain strong adhesive force. It is therefore difficult to peel off the carrier plate from the package panel without damaging the package panel or the carrier plate.

It is accordingly an object of the present invention to provide a carrier plate removing method capable of easily removing a carrier plate from a workpiece such as a package panel or the like.

In accordance with an aspect of the present invention, there is provided a carrier plate removing method of removing a carrier plate from a workpiece disposed on a front surface of the carrier plate with a provisional bond layer interposed between the carrier plate and the workpiece, the carrier plate removing method including: a first holding step of holding the carrier plate by a first holding unit and exposing the workpiece; a stepped portion forming step of forming a stepped portion in which an back surface side projects outward of a front surface side at an outer peripheral edge of the carrier plate by processing the carrier plate from the workpiece side along the outer peripheral edge of the carrier plate after performing the first holding step; a second holding step of holding the workpiece by a second holding unit and exposing the carrier plate after performing the stepped portion forming step; and a carrier plate removing step of removing the carrier plate from the workpiece by applying a force to the stepped portion and moving the carrier plate in a direction of being separated from the workpiece by a removing unit after performing the second holding step.

In one mode of the present invention, in the carrier plate removing step, a fluid is preferably blown between the workpiece and the carrier plate while the force is applied to the stepped portion by the removing unit.

In the carrier plate removing method according to the aspect of the present invention, a stepped portion in which an back surface side projects outward of a front surface side is formed at the outer peripheral edge of the carrier plate by processing the carrier plate from the workpiece side along the outer peripheral edge of the carrier plate. Hence, the carrier plate can be removed from the workpiece easily by applying a force to the stepped portion in a state of holding the workpiece and moving the carrier plate in a direction of being separated from the workpiece.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE
PREFERRED EMBODIMENT

An embodiment according to an aspect of the present invention will be described with reference to the accompanying drawings. A carrier plate removing method according to the present embodiment includes a first holding step (see FIG. 1B), a stepped portion forming step (see FIG. 2A and FIG. 2B), a second holding step (see FIG. 3A), and a carrier plate removing step (see FIG. 3B).

In the first holding step, the carrier plate side of a composite substrate including a carrier plate and a workpiece is held, and the workpiece side of the composite substrate is exposed. In the stepped portion forming step, a stepped portion in an outer peripheral edge of the carrier plate is formed by making a cutting blade cut along the outer peripheral edge of the carrier plate. In the second holding step, the workpiece side of the composite substrate is held, and the carrier plate side is exposed. In the carrier plate removing step, the carrier plate is removed from the workpiece by applying a force to the stepped portion of the carrier plate, and moving the carrier plate in a direction of being separated from the workpiece. The carrier plate removing method according to the present embodiment will be described in detail in the following.

Figure 1A:
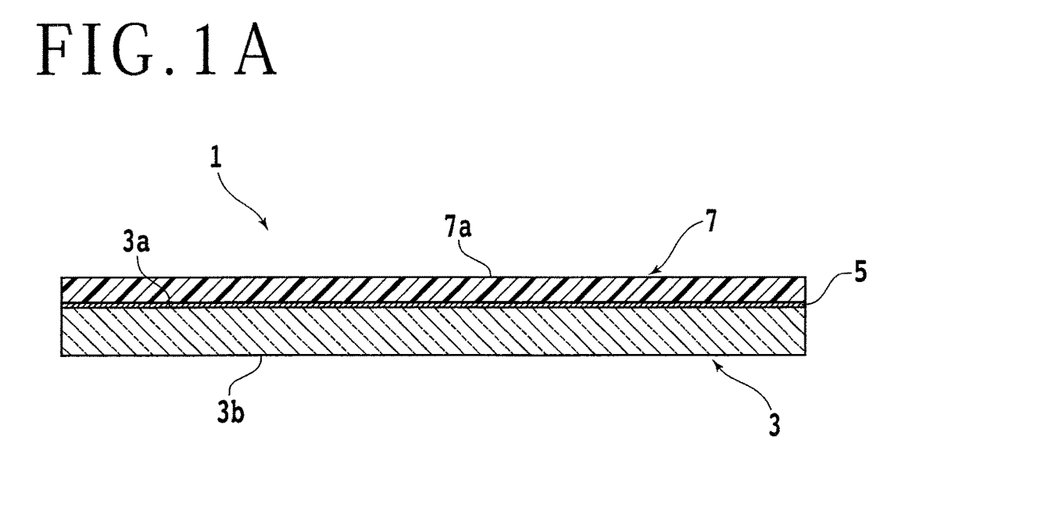
FIG. 1A is a sectional view depicting an example of constitution of a composite substrate including a carrier plate and a workpiece.

FIG. 1A is a sectional view depicting an example of constitution of a composite substrate 1 used in the carrier plate removing method according to the present embodiment. The composite substrate 1, for example, includes a carrier plate 3 formed of an insulator material such as soda glass, borosilicate glass, quartz glass, or the like. The carrier plate 3, for example, has a substantially flat first surface (front surface) 3a and a second surface (back surface) 3b on an opposite side from the first surface 3a. The carrier plate 3 is formed in a rectangular shape as viewed in plan from the first surface 3a side or the second surface 3b side. The thickness of the carrier plate 3 is, for example, 2 mm or less, or typically 1.1 mm.

It is to be noted that while the carrier plate 3 formed of an insulator material such as soda glass, borosilicate glass, quartz glass, or the like is used in the present embodiment, there is no particular limitation on the material, shape, structure, size, and the like of the carrier plate 3. For example, a plate or the like formed of a material such as a semiconductor, a ceramic, a resin, a metal, or the like can also be used as the carrier plate 3. A disk-shaped semiconductor wafer or the like may also be set as the carrier plate 3.

A workpiece 7 is disposed on the first surface 3a side of the carrier plate 3 with a provisional bond layer 5 interposed therebetween. The provisional bond layer 5 is, for example, disposed on substantially the whole of the first surface 3a by superposing a metallic film, an insulator film, or the like. The provisional bond layer 5 has a function of bonding the carrier plate 3 and the workpiece 7 to each other. The thickness of the provisional bond layer 5 is, for example, 20 μm or less, or typically 5 μm. When the carrier plate 3 is peeled off and removed from the workpiece 7 in the carrier plate removing step to be described later, the provisional bond layer 5 is separated into a first part adhering to the carrier plate 3 side and a second part adhering to the workpiece 7 side.

The workpiece 7 is, for example, referred to also as a package panel, a package wafer, or the like. The workpiece 7 includes a wiring layer (RDL) in contact with the provisional bond layer 5, a plurality of device chips bonded to the wiring layer, and a mold resin layer sealing each of the device chips. The workpiece 7 is, for example, formed in substantially the same size and shape as the carrier plate 3 as viewed in plan. The thickness of the workpiece 7 is, for example, 1.5 mm or less, or typically 0.6 mm.

Incidentally, the first surface (front surface) 7a side of the workpiece 7 may be processed by a method such as grinding or the like. In addition, planned dividing lines (planned cutting lines) are set on regions between the device chips adjacent to one another within the workpiece 7. A plurality of packaged devices corresponding to the respective device chips are obtained by cutting the workpiece 7 along the planned dividing lines. However, there is no particular limitation on the material, shape, structure, size, and the like of the workpiece 7.

Figure 1B:
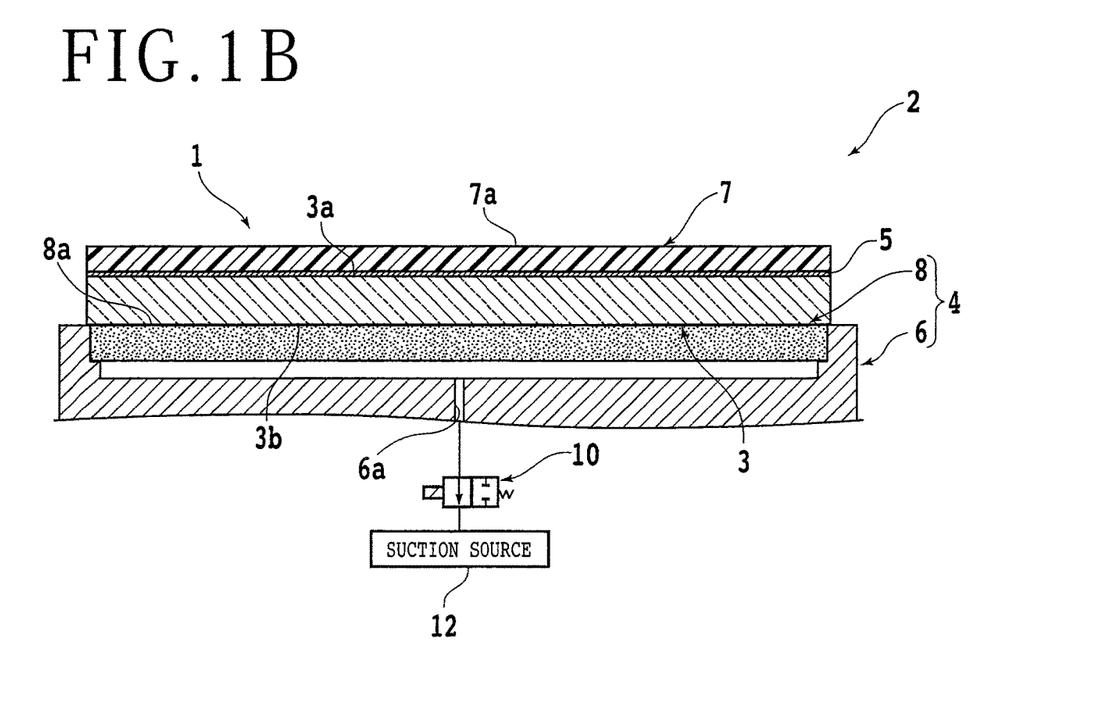
FIG. 1B is a sectional view depicting a first holding step.

In the carrier plate removing method according to the present embodiment, the first holding step is first performed in which the carrier plate 3 side of the above-described composite substrate 1 is held and the workpiece 7 side is exposed. FIG. 1B is a sectional view depicting the first holding step. Incidentally, in FIG. 1B, some constituent elements are represented by functional blocks.

The first holding step is performed by using a cutting apparatus 2 depicted in FIG. 1B and the like. The cutting apparatus 2 includes a chuck table (first holding means or a first holding unit) 4 for holding the composite substrate 1. The chuck table 4, for example, includes a cylindrical frame body 6 formed of a metallic material typified by a stainless steel and a holding plate 8 formed of a porous material and disposed in an upper portion of the frame body 6.

The top surface of the holding plate 8 is a holding surface 8a for sucking and holding the carrier plate 3 side of the composite substrate 1. The undersurface side of the holding plate 8 is connected to a suction source 12 via a flow passage 6a, a valve 10, and the like, and the flow passage 6a is provided within the frame body 6. Therefore, when the valve 10 is opened, a negative pressure of the suction source 12 can be made to act on the holding surface 8a.

The chuck table 4 (frame body 6) is coupled to a rotation-driving source (not depicted) such as a motor or the like, and is thereby rotated about a rotational axis substantially perpendicular to the above-described holding surface 8a. In addition, the chuck table 4 (frame body 6) is supported by a processing feed mechanism (not depicted), and is thereby moved in a processing feed direction substantially parallel with the above-described holding surface 8a.

In the first holding step, as depicted in FIG. 1B, for example, the second surface 3b of the carrier plate 3 is brought into contact with the holding surface 8a of the chuck table 4. Then, the valve 10 is opened to make a negative pressure of the suction source 12 act on the holding surface 8a. The carrier plate 3 side of the composite substrate 1 is thereby sucked and held by the chuck table 4. That is, the workpiece 7 of the composite substrate 1 is exposed upward.

Figure 2A:
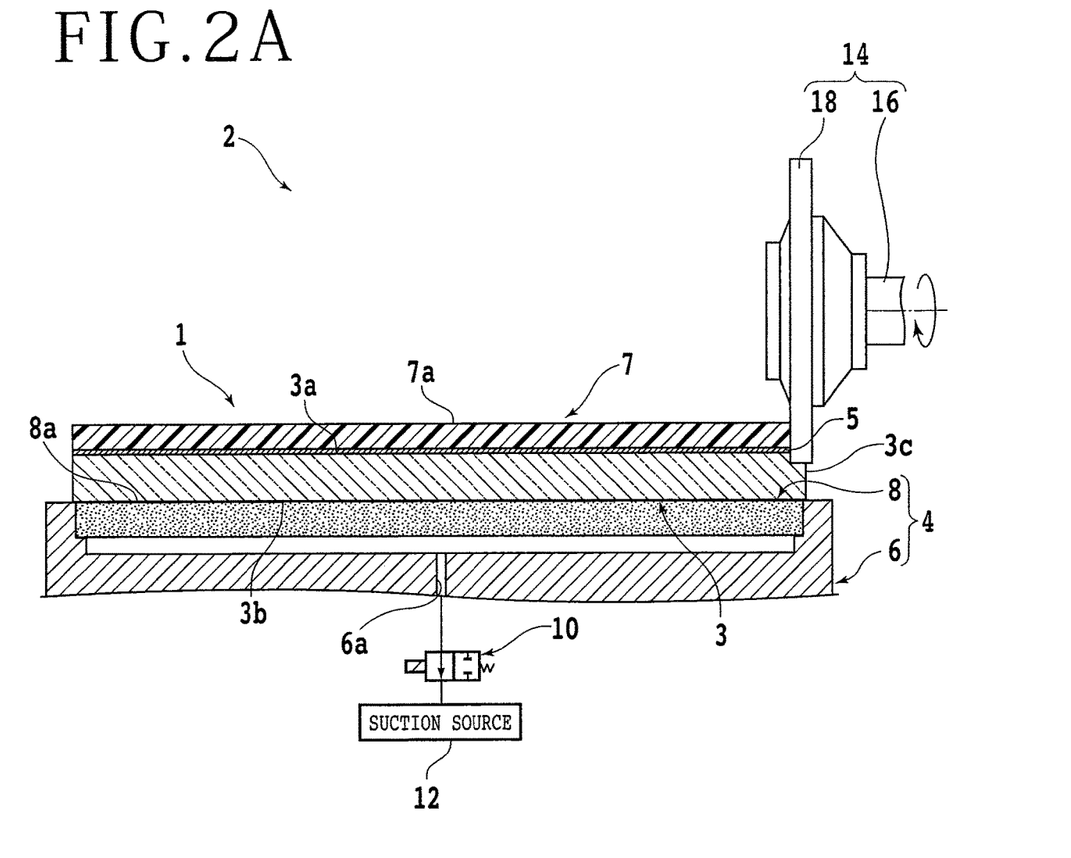
FIG. 2A is a sectional view depicting a stepped portion forming step.
Figure 2B:
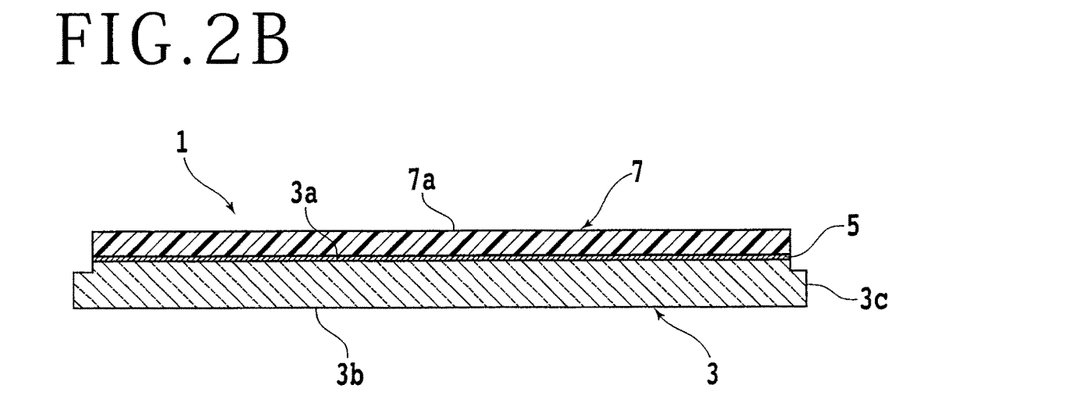
FIG. 2B is a sectional view depicting a state in which a stepped portion is formed in the carrier plate.

After the first holding step, the stepped portion forming step is performed in which a stepped portion in the outer peripheral edge of the carrier plate 3 is formed. FIG. 2A is a sectional view depicting the stepped portion forming step. FIG. 2B is a sectional view depicting a state in which the stepped portion 3c is formed in the carrier plate 3. Incidentally, in FIG. 2A, some constituent elements are represented by functional blocks.

The stepped portion forming step is performed by continuing to use the cutting apparatus 2. As depicted in FIG. 2A, a cutting unit 14 is disposed above the chuck table 4. The cutting unit 14 includes a spindle 16 as a rotational axis substantially parallel with the holding surface 8a. An annular cutting blade 18 formed by dispersing abrasive grains in a bonding material is fitted to one end side of the spindle 16.

A rotation-driving source (not depicted) such as a motor or the like is coupled to another end side of the spindle 16. The cutting blade 18 fitted to the one end side of the spindle 16 is rotated by a force transmitted from the rotation-driving source. The cutting unit 14 is, for example, supported by a raising and lowering mechanism (not depicted) and an indexing feed mechanism (not depicted), and is thus moved in a vertical direction substantially perpendicular to the holding surface 8a and an indexing feed direction substantially perpendicular to the vertical direction and the processing feed direction.

In the stepped portion forming step, first, a part of the outer peripheral edge of the carrier plate 3 as a target of processing (part corresponding to one side of a rectangle as viewed in plan) is set substantially parallel with the processing feed direction by rotating the chuck table 4 holding the composite substrate 1. Next, the cutting blade 18 is positioned above an extension of the above-described part of the outer peripheral edge by moving the chuck table 4 and the cutting unit 14 relative to each other.

In addition, the lower end of the cutting blade 18 is positioned at a position lower than the first surface 3a of the carrier plate 3 and higher than the second surface 3b of the carrier plate 3. Thereafter, the chuck table 4 is moved in the processing feed direction while the cutting blade 18 is rotated. Consequently, the cutting blade 18 is made to cut in from the first surface 3a side (workpiece 7 side) to a depth not reaching the second surface 3b along the outer peripheral edge of the carrier plate 3, so that a stepped portion 3c in which the second surface 3b side projects outward of the first surface 3a side (outward in a direction parallel with the first surface 3a or the second surface 3b) can be formed.

An overlapping width of the outer peripheral edge of the carrier plate 3 and the cutting blade 18 (that is, the width or the amount of projection of the formed stepped portion 3c) is set in a range not affecting the packaged devices cut out from the workpiece 7 or the like. For example, in a case where a surplus region (peripheral surplus region) set in the periphery of the workpiece 7 has a large width, the overlapping width of the outer peripheral edge of the carrier plate 3 and the cutting blade 18 (width of the stepped portion 3c) can also be set large. In consideration of ease of removal of the carrier plate 3 and the like, the width of the stepped portion 3c is preferably set between 0.2 mm and 3 mm both inclusive, for example.

As described above, the provisional bond layer 5 and the workpiece 7 are formed in substantially the same size and shape as the carrier plate 3 as viewed in plan. Therefore, when the cutting blade 18 is made to cut in from the first surface 3a side (workpiece 7 side) to the outer peripheral edge of the carrier plate 3, corresponding regions of the provisional bond layer 5 and the workpiece 7 are cut and removed at the same time. After the stepped portion 3c is formed in a part of the outer peripheral edge of the carrier plate 3, a similar procedure is repeated to form the stepped portion 3c also in another part of the outer peripheral edge of the carrier plate 3. The stepped portion forming step is ended when the stepped portion 3c is formed in the whole of the outer peripheral edge of the carrier plate 3.

Incidentally, while the stepped portion 3c is formed in the whole of the outer peripheral edge of the carrier plate 3 in the present embodiment, it suffices for the stepped portion 3c to be formed in at least a part of the outer peripheral edge of the carrier plate 3. In addition, in a case where the carrier plate 3 and the workpiece 7 have a circular shape (that is, a disk shape) as viewed in plan, the stepped portion 3c can be formed along the outer peripheral edge of the carrier plate 3 by rotating the chuck table 4 while making the cutting blade 18 cut into the outer peripheral edge of the carrier plate 3, for example.

Figure 3A:
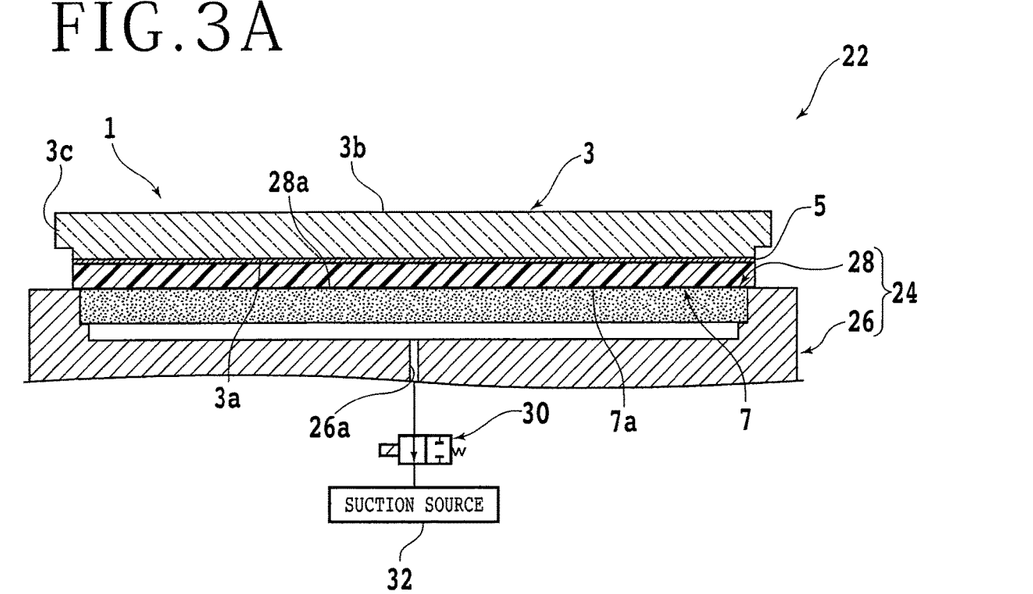
FIG. 3A is a sectional view depicting a second holding step.

After the stepped portion forming step, the second holding step is performed in which the workpiece 7 side of the composite substrate 1 is held and the carrier plate 3 side is exposed. FIG. 3A is a sectional view depicting the second holding step. Incidentally, in FIG. 3A, some constituent elements are represented by functional blocks.

The second holding step is performed by using a removing apparatus 22 depicted in FIG. 3A and the like. The removing apparatus 22 includes a chuck table (second holding means or a second holding unit) 24 for holding the composite substrate 1. The structure and the like of the chuck table 24 are substantially the same as those of the chuck table 4 of the above-described cutting apparatus 2.

Specifically, the chuck table 24 includes a cylindrical frame body 26 formed of a metallic material typified by a stainless steel and a holding plate 28 formed of a porous material and disposed in an upper portion of the frame body 26. The top surface of the holding plate 28 is a holding surface 28a for sucking and holding the workpiece 7 side of the composite substrate 1. The undersurface side of the holding plate 28 is connected to a suction source 32 via a flow passage 26a, a valve 30, and the like, and the flow passage 26a is provided within the frame body 26. Therefore, when the valve 30 is opened, a negative pressure of the suction source 32 can be made to act on the holding surface 28a.

In the second holding step, as depicted in FIG. 3A, for example, the first surface 7a of the workpiece 7 is brought into contact with the holding surface 28a of the chuck table 24. Then, the valve 30 is opened to make a negative pressure of the suction source 32 act on the holding surface 28a. The workpiece 7 side of the composite substrate 1 is thereby sucked and held by the chuck table 24. That is, the carrier plate 3 of the composite substrate 1 is exposed upward.

Incidentally, while the first surface 7a of the workpiece 7 is brought into direct contact with the holding surface 28a of the chuck table 24 in the second holding step of the present embodiment, a porous sheet or the like may be interposed between the first surface 7a of the workpiece 7 and the holding surface 28a of the chuck table 24. It is thereby possible to prevent damage, contamination, and the like of the workpiece 7 due to the contact with the holding surface 28a.

Figure 3B:
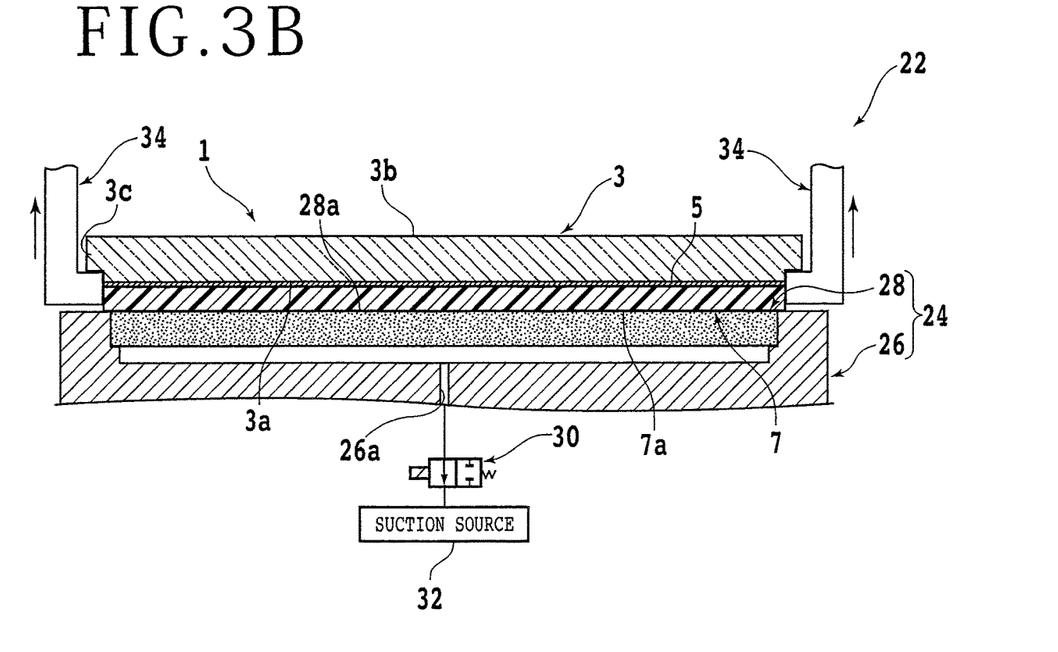
FIG. 3B is a partially sectional side view depicting a carrier plate removing step.

After the second holding step, the carrier plate removing step is performed in which the carrier plate 3 is removed from the workpiece 7. FIG. 3B is a partially sectional side view depicting the carrier plate removing step. Incidentally, in FIG. 3B, some constituent elements are represented by functional blocks.

The carrier plate removing step is performed by continuing to use the removing apparatus 22. As depicted in FIG. 3B, a plurality of removing arms (removing means or a removing unit) 34 for removing the carrier plate 3 are arranged above the chuck table 24. Each of the removing arms 34 has, at an end portion thereof, a pawl-shaped structure capable of supporting the stepped portion 3c of the carrier plate 3. In addition, a moving mechanism (not depicted) that moves each removing arm 34 is coupled to the base end side of each removing arm 34.

In the carrier plate removing step, first, each removing arm 34 is moved to such a position as to be able to support the stepped portion 3c of the carrier plate 3 from below by the pawl-shaped end portion of each removing arm 34. Then, as depicted in FIG. 3B, each removing arm 34 is raised by the moving mechanism. That is, each removing arm 34 applies an upward force to the stepped portion 3c of the carrier plate 3.

As described above, the workpiece 7 side of the composite substrate 1 is sucked and held by the chuck table 24. Therefore, when an upward force is applied to the stepped portion 3c of the carrier plate 3 by each removing arm 34, the carrier plate 3 is peeled off from the workpiece 7 with the provisional bond layer 5 as a boundary, and is raised. That is, the carrier plate 3 moves in a direction of being separated from the workpiece 7. The carrier plate removing step is ended when the whole of the carrier plate 3 is separated and removed from the workpiece 7.

Incidentally, the carrier plate 3 separated from the workpiece 7 is, for example, carried out to the outside of the chuck table 24 as it is by each removing arm 34. Needless to say, the carrier plate 3 after the separation may be carried out to the outside of the chuck table 24 by using another conveyance unit including a suction pad or the like.

As described above, in the carrier plate removing method according to the present embodiment, the stepped portion 3c in which the second surface (back surface) 3b side (second surface 3b side part) projects outward of the first surface (front surface) 3a side (first surface 3a side part) is formed in the outer peripheral edge of the carrier plate 3 by making the cutting blade 18 cut in from the workpiece 7 side to a depth not reaching the back surface of the carrier plate 3 along the outer peripheral edge of the carrier plate 3. Hence, the carrier plate 3 can be removed from the workpiece 7 easily by applying a force to the stepped portion 3c in a state of holding the workpiece 7 and moving the carrier plate 3 in a direction of being separated from the workpiece 7.

It is to be noted that the present invention is not limited to the description of the foregoing embodiment, but can be changed and carried out in various manners. For example, while the carrier plate 3 is removed from the workpiece 7 by using the cutting apparatus 2 and the removing apparatus 22 in the foregoing embodiment, the carrier plate 3 may be removed from the workpiece 7 by using an apparatus combining the functions of the cutting apparatus 2 and the removing apparatus 22.

More specifically, for example, the removing arms 34 and the like of the removing apparatus 22 can be incorporated in the cutting apparatus 2. Needless to say, the cutting unit 14 and the like of the cutting apparatus 2 may be incorporated in the removing apparatus 22. Incidentally, in these cases, the first holding step and the second holding step are performed by using the same chuck table (the chuck table 4 or the chuck table 24).

In addition, while the stepped portion 3c is formed by making the cutting blade 18 cut in from the workpiece 7 side along the outer peripheral edge of the carrier plate 3 in the foregoing embodiment, the stepped portion 3c may be formed by, for example, applying a laser beam from the workpiece 7 side along the outer peripheral edge of the carrier plate 3. In this case, a laser processing apparatus (laser processing unit) capable of applying a laser beam of a wavelength absorbed by at least the carrier plate 3 is used in place of the cutting apparatus 2 (cutting unit 14).

Figure 4A:
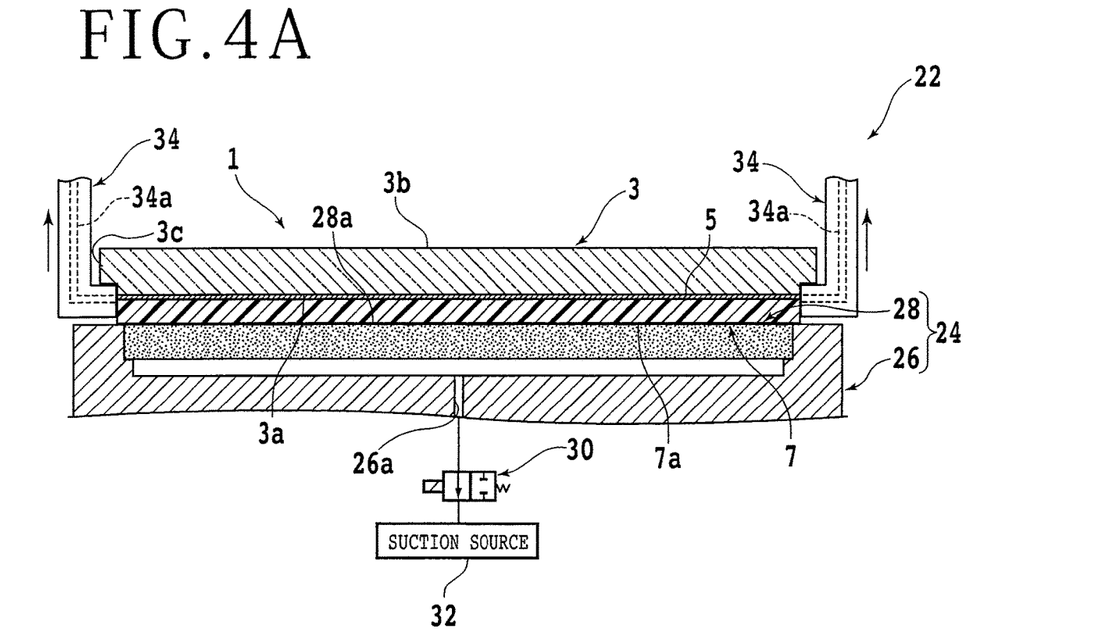
FIG. 4A is a partially sectional side view depicting a carrier plate removing step according to a first modification.

In addition, it is possible to blow a fluid between the carrier plate 3 and the workpiece 7 (region corresponding to the provisional bond layer 5) when removing the carrier plate 3 in the carrier plate removing step. FIG. 4A is a partially sectional side view depicting a carrier plate removing step according to a first modification. As depicted in FIG. 4A, a flow passage 34a for supplying a fluid is provided within the removing arms 34 used in the carrier plate removing step according to the first modification.

The upstream sides of the flow passages 34a are connected to a fluid supply source (not depicted) via a valve (not depicted) or the like. On the other hand, downstream ends of the flow passages 34a are opened at end portions of the removing arms 34. Therefore, the fluid can be blown between the carrier plate 3 and the workpiece 7 when the valve is opened while the end portion of each removing arm 34 supports the stepped portion 3c of the carrier plate 3 from below.

The carrier plate 3 can be peeled off from the workpiece 7 more easily by, for example, applying a force to the stepped portion 3c by the removing arms 34 while blowing the fluid between the carrier plate 3 and the workpiece 7. A usable fluid blown between the carrier plate 3 and the workpiece 7 is, for example, air, water, or the like. However, there is no particular limitation on the kind of the fluid or the like.

Figure 4B:
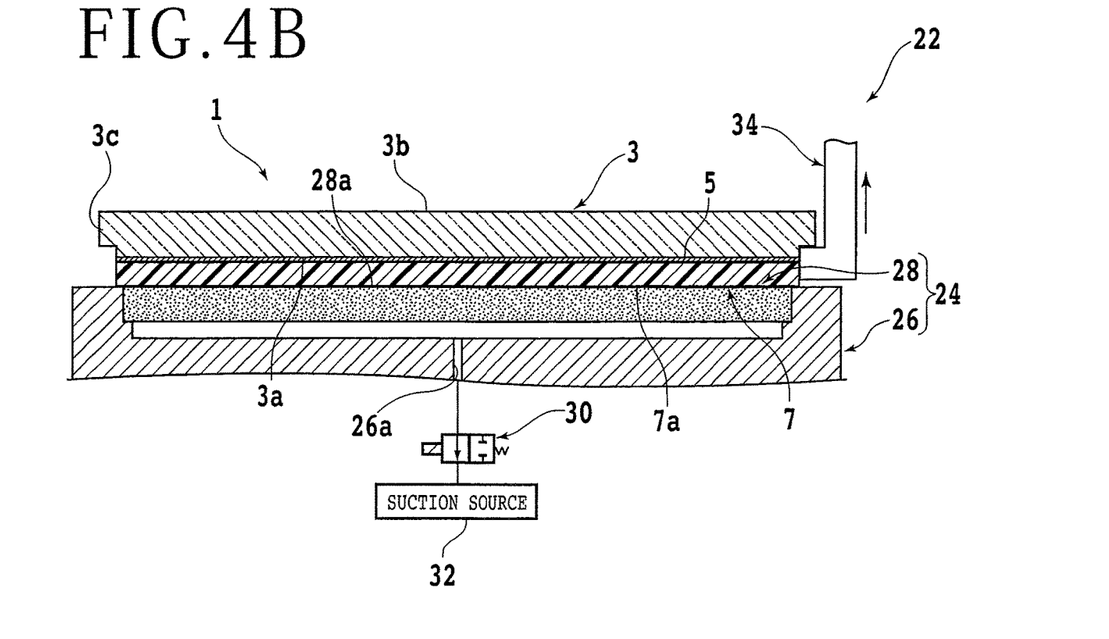
FIG. 4B is a partially sectional side view depicting a carrier plate removing step according to a second modification.

In addition, while the plurality of removing arms 34 are used to peel off and remove the carrier plate 3 from the workpiece 7 in the foregoing embodiment or the like, the carrier plate 3 can also be peeled off and removed from the workpiece 7 by using one removing arm 34. FIG. 4B is a partially sectional side view depicting a carrier plate removing step according to a second modification in which the carrier plate 3 is peeled off and removed from the workpiece 7 by using one removing arm 34.

Figure 5A:
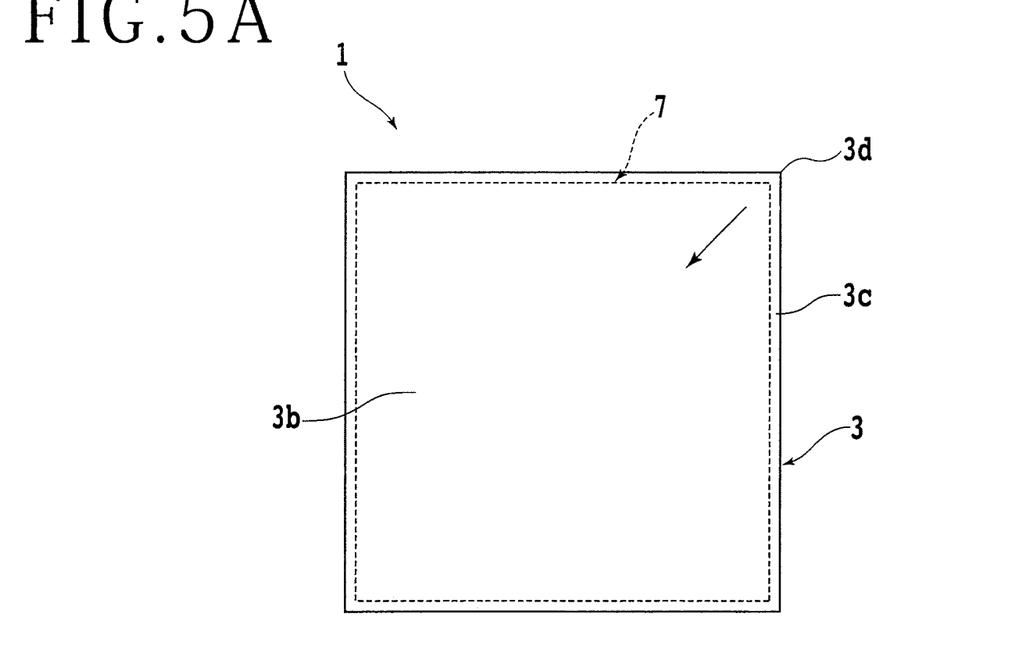
FIG. 5A is a partially sectional side view depicting a carrier plate removing step according to a third modification.
Figure 5B:
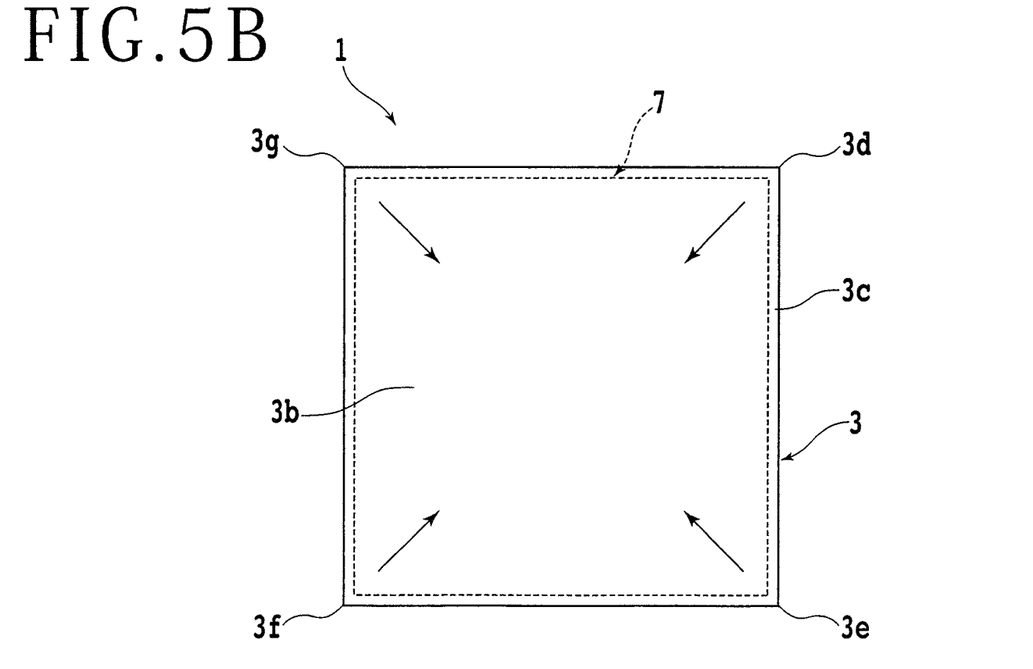
FIG. 5B is a partially sectional side view depicting a carrier plate removing step according to a fourth modification.

In addition, there is no particular limitation on the position or the like of the stepped portion 3c supported by the removing arms 34 in the carrier plate removing step. FIG. 5A is a partially sectional side view depicting a carrier plate removing step according to a third modification. FIG. 5B is a partially sectional side view depicting a carrier plate removing step according to a fourth modification.

In the carrier plate removing step according to the third modification, as depicted in FIG. 5A, the stepped portion 3c is supported at a position corresponding to one corner 3d of the carrier plate 3 by a removing arm 34, and the carrier plate 3 is peeled off. In this case, the carrier plate 3 is gradually peeled off along the direction of a diagonal line from the position corresponding to the corner 3d.

On the other hand, in the carrier plate removing step according to the fourth modification, as depicted in FIG. 5B, the stepped portion 3c is supported at positions corresponding to four corners 3d, 3e, 3f, and 3g of the carrier plate 3 by removing arms 34, and the carrier plate 3 is peeled off. In this case, the carrier plate 3 is gradually peeled off along the directions of diagonal lines from the positions corresponding to the corners 3d, 3e, 3f, and 3g.

In addition, structures, methods, and the like according to the foregoing embodiment can be changed and carried out as appropriate without departing from the objective scope of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A carrier plate removing method of removing a carrier plate from a workpiece disposed on a front surface of the carrier plate with a provisional bond layer interposed between the carrier plate and the workpiece, the carrier plate removing method comprising:
 a first holding step of holding the carrier plate by a first holding unit and exposing the workpiece;
 a stepped portion forming step of forming a stepped portion in which a back surface side projects outward of a front surface side at an outer peripheral edge of the carrier plate by processing the carrier plate from the workpiece side along the outer peripheral edge of the carrier plate after performing the first holding step;
 a second holding step of holding the workpiece by a second holding unit and exposing the carrier plate after performing the stepped portion forming step; and
 a carrier plate removing step of removing the carrier plate from the workpiece by applying a force to the stepped portion and moving the carrier plate in a direction of being separated from the workpiece by a removing unit after performing the second holding step.

2. The carrier plate removing method according to claim 1, wherein
 in the carrier plate removing step, a fluid is blown between the workpiece and the carrier plate while the force is applied to the stepped portion by the removing unit.

* * * * *